United States Patent [19]
Onishi et al.

[11] Patent Number: 5,909,657
[45] Date of Patent: Jun. 1, 1999

[54] SEMICONDUCTOR DEVICE TESTING APPARATUS

[75] Inventors: Takeshi Onishi, Gyoda; Katsuhiko Suzuki, Saitama, both of Japan

[73] Assignee: Advantest Corporation, Tokyo, Japan

[21] Appl. No.: 08/867,750

[22] Filed: Jun. 3, 1997

[30] Foreign Application Priority Data

Jun. 4, 1996 [JP] Japan ................................. 8-141820

[51] Int. Cl.⁶ ................................................ G06F 19/00
[52] U.S. Cl. ............................................................ 702/108
[58] Field of Search ................................. 702/108, 117;
364/478.03, 468.17, 468.28, 490; 414/403,
404, 416; 29/705

[56] References Cited

U.S. PATENT DOCUMENTS 5,715,168  2/1998  Ito ........................................ 364/478.03
5,772,387  6/1998  Nakamura et al. ...................... 414/416

Primary Examiner—Kamini Shah
Attorney, Agent, or Firm—Staas & Halsey

[57] ABSTRACT

A semiconductor device testing apparatus in which ICs to be tested are loaded on a test tray in a loader section, the test tray is transported into a test section to test the ICs, after the completion of the test, the tested ICs on the test tray are transferred from the test tray onto a general-purpose tray in an unloader section, the test tray which has been emptied of the tested ICs is transported to the loader section, and the above operation is repeated, and which can detect a failure of an IC carrier mounted to the test tray independently of detection of a failure IC socket is provided. An IC carrier failure analysis memory is provided which has storage addresses the number of which is equal to the number of IC carriers mounted to each of the test trays, and the number of ICs as determined to be defective is stored and accumulated in each of the storage addresses of the IC carrier failure analysis memory. When the accumulated value exceeds a setting value, a decision is rendered that the associated IC carrier on which the ICs as determined to be defective have been loaded is defective.

16 Claims, 8 Drawing Sheets

SEMICONDUCTOR DEVICE TESTING APPARATUS

BACKGROUND OF THE INVENTION

1. Field of the Invention

The present invention relates to a semiconductor device testing apparatus for testing one or more semiconductor devices, particularly one or more semiconductor integrated circuit elements (as will be referred to as IC or ICs hereinafter) which are typical examples of the semiconductor devices as to whether an IC or ICs operate in normal manner or not. More particularly, the present invention relates to a semiconductor device testing apparatus of the type in which one or more ICs to be tested (IC under test) are loaded on a test tray and transported together with the test tray, for testing, to a test or testing section where the ICs are brought into electrical contact with a socket or sockets of a tester head (a component of the testing apparatus for applying and receiving various electrical signals for testing) in the state that they remain loaded on the test tray to perform an electrical test of the ICs, after the testing, carry the tested ICs out of the test section, and to sort out the tested ICs into conformable or pass articles and unconformable or failure articles on the basis of the data of the test results.

2. Description of the Related Art

Many of electrical portions (commonly called tester part) of semiconductor device testing apparatus for applying a test signal of a predetermined pattern to a semiconductor device to be tested, i.e. device under test (commonly called DUT) and measuring the electrical characteristics of the devices, have a semiconductor device transporting and handling or processing apparatus (commonly called handler) connected or mounted thereto which transports semiconductor devices to a test section, brings them into electrical contact with sockets of a tester head in the test section, after the testing, carries the tested semiconductor devices out of the test section, and sorts out them into pass articles and failure articles on the basis of the data of the test results. In the specification of the present application, the testing apparatus which comprises a combination of the tester part and the handler connected thereto or integrally mounted thereto of the type described above is termed "semiconductor device testing apparatus". In the following disclosure the present invention will be described by taking ICs typical of semiconductor devices, for example, for clarity of explanation.

A description will be given first regarding the general construction of a conventional IC testing apparatus having a handler called "horizontal transporting system" mounted thereto with reference to FIGS. 4 and 5. The illustrated IC testing apparatus comprises a chamber section 100 for testing ICs such as semiconductor memories which are loaded on a test tray TST and carried on the test tray TST, an IC storage section 200 where ICs which will undergo a test (i.e., ICs to be tested) are sorted out and the tested ICs are sorted out and stored in place, a loader section 300 where ICs to be tested which a user has beforehand loaded on a general-purpose tray (customer tray) KST are transferred and reloaded onto a test tray TST capable of withstanding high/low temperatures, and an unloader section 400 where the tested ICs which have been carried on the test tray TST out of the chamber section 100 subsequently to undergoing a test in the testing chamber 100 are transferred from the test tray TST to one or more general-purpose trays KST to be reloaded on the latter. The unloader section 400 is generally constructed to sort out the tested ICs by categories on the basis of the data of the test results and load them on the corresponding general-purpose trays.

The chamber section 100 comprises a constant temperature or thermostatic chamber 101 for receiving the ICs to be tested loaded on the test tray TST and imposing an intended high or low temperature stress to the ICs, a test or testing chamber 102 for effecting an electrical test on the ICs subjected to the temperature stress in the constant temperature chamber 101, and a temperature-stress removing chamber 103 for removing the temperature stress of the ICs having been applied thereto in the test chamber 102 from the ICs. The test chamber 102 contains therein a tester head 104 of the testing apparatus, supplies various electric signals for testing via the tester head 104 to the ICs under test in electrically contact with sockets mounted to the tester head 104, receives response signals from the ICs, and sends them to the tester part of the testing apparatus.

Each of the test trays TST is moved in a circulating manner from the loader section 300 through the constant temperature chamber 101 of the chamber section 100, the test chamber 102 of the chamber section 100, the temperature-stress removing chamber 103 of the chamber section 100, and the unloader section 400 in this order, to the loader section 300. The constant temperature chamber 101 and the temperature-stress removing chamber 103 are taller than the test chamber 102, and have upward portions protruding beyond the top of the test chamber 102, respectively. As shown in FIG. 5, a base plate 105 spans between the upward protruding portions of the constant temperature chamber 101 and the temperature-stress removing chamber 103, and a test tray conveying means 108 is mounted on the base plate 105 to transport the test tray TST from the temperature-stress removing chamber 103 to the constant temperature chamber 101.

In case a temperature stress of a high temperature (a thermal stress) has been applied to the ICs to be tested in the constant temperature chamber 101, the temperature-stress removing chamber 103 cools the tested ICs down to room temperature by blowing, after which they are transported to the unloader section 400. On the other hand, in case a temperature stress of a low temperature such as, for instance, −30° C. (a cryogenic stress) has been applied to the ICs to be tested in the constant temperature chamber 101, the temperature-stress removing chamber 103 heats the tested ICs by warm air or a heater up to a temperature at which the ICs have no any dew condensation, and then they are carried out of the temperature-stress removing chamber 103 to the unloader section 400.

The test tray TST with the ICs loaded thereon in the loader section 300 is conveyed from the loader section to the constant temperature chamber 101 within the chamber section 100. The constant temperature chamber 101 has a vertical conveyor means mounted therein which is adapted to support a plurality of (nine, for instance) test trays TST in the form of a stack. In the illustrated example, the vertical conveyor means stacks the transported test trays such that a test tray newly received from the loader section 300 is supported at the uppermost of the stack while the bottom test tray is delivered to the test chamber 102. The ICs to be tested on the uppermost test tray TST are given a predetermined high or low temperature stress while the associated test tray TST is moved sequentially from the top to the bottom of the stack by vertically downward movement of the vertical conveyor means and/or waits till the immediately preceding test tray is brought out of the test chamber 102.

The tester head 104 is disposed in the test chamber 102 at the central area thereof, and each of the test trays TST carried out one by one from the constant temperature chamber 101 is conveyed onto the tester head 104 while maintained at the constant temperature, and a predetermined number of the ICs among the ICs on the associated test tray TST are electrically connected to IC sockets (not shown) mounted on the tester head 104, as will be discussed hereinbelow. Upon completion of the test on all of the ICs placed on one test tray TST through the tester head 104, the test tray TST is transported to the temperature-stress removing chamber 103 where the tested ICs on the associated test tray are relieved of temperature stress to be restored to the ambient or room temperature, and thereafter the test tray TST is discharged to the unloader section 400.

Like the constant temperature chamber 101 as described above, the temperature-stress removing chamber 103 is also equipped with a vertical conveyor means adapted to support a plurality of (nine, for instance) test trays TST stacked one on another. In the illustrated example, the test tray TST newly received from the test chamber 102 is supported at the bottom of the stack while the uppermost test tray is discharged to the unloader section 400. The tested ICs on the associated test tray are relieved of temperature stress to be restored to the outside temperature (room temperature) as the associated test tray TST is moved from the bottom to the top of the stack by vertically upward movement of the vertical conveyor means.

The tested ICs as carried on the test tray TST are passed to the unloader section 400 where they are sorted out by categories based on the test results and transferred from the test tray TST onto and stored in the corresponding general-purpose trays for respective categories. The test tray TST thus emptied in the unloader section 400 is transported to the loader section 300 where it is again loaded with ICs to be tested from a general-purpose tray KST onto the test tray TST, after which the same steps of above-described operation are repeated.

As shown in FIG. 5, an IC transfer means for transferring ICs from a general-purpose tray KST to a test tray TST in the loader section 300 may be in the form of X and Y direction transfer means 304 which comprises a pair of spaced parallel rails 301 mounted on the base plate 105 and extending over the loader section 400 in the front-to-back or forward-rearward direction of the testing apparatus (referred to as the Y direction herein), a movable arm 302 which spans between the two rails 301 and has its opposite ends secured thereto in a manner to be movable in the Y direction, and a movable head 303 which is supported by the movable arm 302 in a manner to be movable in the direction in which the movable arm 302 extends, that is in the left to right direction of the testing apparatus (referred to as the X direction herein). With this arrangement, the movable head 303 is allowed to reciprocate between the test tray TST and the general-purpose tray KST in the Y direction and move along the movable arm 302 in the X direction.

On the underside of the movable head 303 are vertically movably mounted IC suction pads to be described later with reference to FIG. 7. Through the movement of the movable head 303 in the X and Y directions and the downward movement of the suction pads in combination, the suction pads are brought into abutment with the ICs placed on the general-purpose tray KST and pick them up and hold thereto by vacuum suction to transfer them to the test tray TST. The number of suction pads that are mounted on the movable head 303 may be eight, for instance, so that a total of eight ICs may be transferred from the general-purpose tray KST to the test tray TST at one time.

It is to be noted here that means 305 for correcting the position of an IC called "preciser" is located between stopping positions for the general-purpose tray KST and the test tray TST. The position correcting means 305 includes relatively deep recesses into which the ICs as being attracted against the suction pads are once released to fall prior to being transferred to the test tray TST. The recesses are each defined by vertical tapered side walls which prescribe for the positions at which the ICs drop into the recesses by virtue of the tapering. After eight ICs have been precisely positioned relative to each other by the position correcting means 305, those eight ICs accurately positioned are again attracted against the suction pads and conveyed to the test tray TST. The reason that the position correcting means 305 is provided is as follows. Recesses of the general-purpose tray TST for holding the ICs are sized larger as compared to the size of ICs, resulting in wide variations in positions of ICs placed on the general-purpose tray KST. Consequently, if the ICs as such were vacuum picked up by the suction pads and transferred directly to the test tray TST, there might be some of the ICs which could not be successfully deposited into the IC storage recesses formed in the test tray TST. This is the reason for requiring the position correcting means 305, as described above which acts to array ICs as accurately as the array of the IC storage recesses formed in the test tray TST.

The unloader section 400 is equipped with two sets of X and Y direction transfer means 404 which are identical in construction to the X and Y direction transfer means 304 provided for the loader section 300. The X and Y direction transfer means 404 perform to transship the tested ICs from the test tray TST delivered out to the unloader section 400 onto the general-purpose tray KST. Each set of the X and Y direction transfer means 404 comprises a pair of spaced parallel rails 401 mounted to extend in the forward-rearward direction of the testing apparatus (Y direction), a movable arm 402 spanning between the pair of rails 401 and movably mounted at opposite ends on the pair of rails 401 in the Y direction, and a movable head 403 mounted on the movable arm 402 for movement therealong longitudinally of the arm, that is, in the right to left direction of the testing apparatus (X direction).

FIG. 6 shows the construction of one example of the test tray TST. The illustrated test tray TST comprises a rectangular frame 12 having a plurality of equally spaced apart parallel cleats 13 between the opposed side frame members 12a and 12b of the frame, each of the cleats 13 having a plurality of equally spaced apart mounting lugs 14 protruding therefrom on both sides thereof and each of the side frame members 12a, 12b opposing the adjacent cleats having similar mounting lugs 14 protruding therefrom. The mounting lugs 14 protruding from the opposed sides of each of the cleats 13 are arranged such that each of the mounting lugs 14 protruding from one side of the cleat 13 is positioned intermediate two adjacent mounting lugs 14 protruding from the opposite side of the cleat. Similarly, each of the mounting lugs 14 protruding from each of the side frame members 12a and 12b is positioned intermediate two adjacent mounting lugs 14 protruding from the opposed cleat. Formed between each pair of opposed cleats 13 and between each of the side frame members 12a and 12b and the opposed cleats are spaces for accommodating a multiplicity of IC carriers 16 in juxtaposition. More specifically, each IC carrier 16 is accommodated in one of an array of rectangular carrier compartments 15 defined in each of said spaces, each compartment 15 including two staggered, obliquely opposed mounting lugs 14 located at the diagonally opposed corners of the compartment. In the illustrated example wherein each cleat 13 has sixteen mounting lugs 14 on either side thereof, there are sixteen carrier compartments 15 formed in each of said spaces, in which sixteen IC carriers 16 are mounted. Since there are four of the spaces, 16×4, that is, 64 IC carriers in total can be mounted in one test tray TST. Each IC carrier 16 is placed on corresponding two mounting lugs 14 and fixed thereto by fasteners 17.

Each of IC carriers 16 is of identical shape and size in its outer contour and has an IC pocket 19 in the center for accommodating an IC element therein. In the illustrated example, the IC pocket 19 is in the shape of a generally square recess. The shape and size of the IC pocket 19 are determined depending on those of the IC element 18 to be accommodated therein. For this reason, every time the shape and size of ICs to be tested differ from those of ICs already tested, IC carriers 16 having IC pockets 19 of the corresponding shape and size are provided, and are substituted for IC carriers presently in use. The outer dimensions of the IC pocket 19 are sized so as to be loosely fitted in the space defined between the opposed mounting lugs 14 in the carrier compartment 15. The IC carrier 16 has flanges at its opposed ends adapted to rest on the corresponding mounting lugs 14, these flanges having mounting holes 21 and holes 22 formed therethrough, respectively, the mounting holes 21 being adapted to receive fasteners 17 therethrough and the holes 22 being adapted to pass locating pins therethrough.

In order to prevent IC elements from slipping out of place within the IC carrier 16 or jumping out of the IC carrier 16, a pair of latches 23 are attached to the IC carrier 16, as shown in FIG. 7. These latches 23 are integrally formed with the body of the IC carrier so as to extend upwardly from the base of the IC pocket 19, and are normally resiliently biased such that the top end pawls are urged toward each other by virtue of the resiliency of the resin material of which the IC carrier is made. When the IC element is to be deposited into or removed from the IC pocket 19, the top ends of the two latches 23 are expanded away from each other by a latch releasing mechanism 25 disposed on opposite sides of an IC suction pad 24 for picking up an IC element prior to effectuating the deposition of the IC element into or removal from the IC pocket 19. Upon the latch releasing mechanism 25 being moved out of engagement with the latches 23, the latches 23 will snap back to their normal positions by their resilient forces where the deposited IC is held in place against dislodgement by the top end pawls of the latches 23.

The IC carrier 16 holds an IC element in place with its leads or pins 18 exposed downwardly as shown in FIG. 8. The tester head 104 has an IC socket mounted thereto, and contacts 104A of the IC socket upwardly extend from the top surface of the tester head 104. The exposed leads 18 of the IC element are pushed against the contacts 104A of the IC socket to establish electrical connection between the IC element and the socket. To this end, a pusher 20 for pushing and holding an IC element down is mounted above the tester head 104 and is configured to push the IC element accommodated in an IC carrier 16 from above into contact with the tester head 104.

Referring to FIGS. 4 and 5 again, the IC storage section 200 comprises an IC storage rack (or stocker) 201 for accommodating general-purpose trays KST loaded with ICs to be tested and a tested IC storage rack (or stocker) 202 for accommodating general-purpose trays KST loaded with tested ICs sorted out by categories on the basis of the test results. The IC storage rack 201 and tested IC storage rack 202 are configured to accommodate general-purpose trays in the form of a stack. The general-purpose trays KST with ICs to be tested carried thereon and stored in the form of a stack in the IC storage rack 201 are transported successively from the top of the stack to the loader section 300 where the ICs to be tested (DUTS) are transferred from the general-purpose tray KST onto a test tray TST on standby in the loader section 300. Further, the IC storage rack 201 and the tested IC storage rack may be of identical shape, configuration and structure.

In the example illustrated in FIGS. 4 and 5, eight racks STK-1, STK-2, . . . , STK-8 are provided as tested IC storage racks 202 SO as to be able to store tested ICs which may be sorted out into eight categories at a maximum according to the test results. This is because in some applications tested ICs may not only be classified into categories of "conformable or pass article" and "unconformable or failure article" but also be subclassified into those having high, medium and low operation speeds among the "pass" articles and those required to be retested among the "failure" articles, and others. Even if the number of classifiable categories is up to eight, the unloader section 400 in the illustrated example is capable of accommodating only four general-purpose trays KST. For this reason, if there occur some among the tested ICs which should be classified into a category other than categories assigned to the general-purpose trays KST arranged in the unloader section 400, the procedures taken are to return one of the general-purpose trays KST from the unloader section 400 to the IC storage section 200 and in replacement to transfer a general-purpose tray KST for storing the ICs belonging to the new additional category from the IC storage section 200 to the unloader section 400 where those ICs are stored in the new tray.

As shown in FIG. 5, a tray transfer means 205 is disposed above the IC storage rack 201 and the tested IC storage racks 202 for movement over the entire extent of the storage racks 201 and 202 in the direction of arrangement of the racks (in the right to left direction of the testing apparatus) relative to the base plate 105. The tray transfer means 205 is provided on its bottom with grasp means for grasping a general-purpose tray KST. The tray transfer means 205 is moved to a position over the IC storage rack 201 whereupon the elevator 204 is actuated to lift the general-purpose trays KST stacked in the IC storage rack 201, so that the uppermost general-purpose tray KST may be picked up by the grasp means of the tray transfer means 205. Once the uppermost general-purpose tray KST loaded with ICs to be tested has been transferred to the tray transfer means 205, the elevator 204 is lowered to its original position. The tray transfer means 205 is then horizontally moved to and stopped at a predetermined position in the loader section 300 where the grasp means of the tray transfer means 205 is released to allow the general-purpose tray KST to drop into an immediately underlying tray receiver (not shown). The tray transfer means 205 from which the general-purpose tray KST has been unloaded is moved out of the loader section 300. Then, the elevator 204 is moved upward from below the tray receiver having the general-purpose tray KST deposited thereon to lift up the tray receiver and hence the general-purpose tray KST loaded with ICs to be tested so that the general-purpose tray KST is kept exposed up through a window 106 formed in the base plate 105.

The base plate 105 is formed in the area overlying the unloader section 400 with another two similar windows 106 through which empty general-purpose trays are kept exposed. In this example, each of the windows 106 is sized to expose two general-purpose trays therethrough. Hence, four empty general-purpose trays are kept exposed up through two windows 106. Tested ICs are sorted out and stored in these empty general-purpose trays KST according to the categories assigned to respective trays. As with the loader section 300, the four empty general-purpose trays KST are placed on the respective tray receivers which are moved up and down by the associated elevators 204. Once one general-purpose tray KST has been fully filled, the tray is lowered from the level of the window 16 by the elevator 204 and stored in the tray storage position assigned to said tray by the tray transfer means 205. Indicated by the reference numeral 206 in FIGS. 4 and 5 is an empty tray storage rack for accommodating empty general-purpose trays KST. From this empty tray storage rack 206, empty general-purpose trays are transported to the respective windows 106 by the tray transfer means 205 and the elevators 204 and held thereat by the associated elevators 204 to be ready for receiving tested ICs.

The number of IC elements which may be connected with the tester head 104 at one time depends on the number of IC sockets mounted on the tester head 104. In case of using a test tray TST of the structure shown in FIG. 6, IC carriers 16 for accommodating IC elements therein are arranged in a matrix of 4 lines×16 rows on that test tray TST as stated before, and hence sixty-four (64) IC elements in total can be loaded on the test tray.

On the contrary, the number of IC elements which can be tested at one time in the IC testing apparatus is limited, and it is difficult to test a large number of IC elements such as 64 IC elements at one time. By way of example, in case the IC testing apparatus is arranged so as to be able to test sixteen (16) IC elements at one time, 4×4, that is, 16 IC sockets in total are arranged and mounted on the tester head 104 such that the IC elements in every fourth row in each of the lines can be tested all at one time. More specifically, in the first test run the examination is conducted on sixteen IC elements (IC elements accommodated in the IC carriers 16 shown by oblique lines) located in the first, fifth, ninth and thirteenth rows in each line, the second test run is effected on another sixteen IC elements located in the second, sixth, tenth and fourteenth rows in each line by shifting the test tray TST by a distance corresponding to one row of IC elements, and the third and fourth test runs are carried out in the similar manner until all of the IC elements are tested.

Further, it is needless to say that where thirty-two IC sockets may be mounted on the tester head 104 in an array of 4×8 such that the IC elements in every second row in each of the lines can be tested all at one time, only two test runs are required to examine all sixty-four IC elements arranged in an array of 4 lines×16 rows.

The test results are stored in a memory at the addresses determined by, for instance, the identification number affixed to the test tray TST and the numbers of the IC carriers 16 assigned thereto within the test tray TST. The test results are used as the data for sorting out the tested ICs into pass articles and failure articles in transferring the tested ICs from the test tray TST to one or more general-purpose trays KST to be reloaded on the latter in the unloader section 400. The data are erased from the memory when the sorting operation is completed.

Heretofore, there are provided memories the number of which corresponds to that of IC sockets of the tester head 104, namely, one memory for one IC socket, and a method is used which comprises the steps of counting the number of occurrence of failure on ICs tested through the same IC socket to store the count value in the corresponding memory, determining that when the stored number of failure occurrence exceeds a predetermined value, the associated socket has a defect, and controlling such that an IC to be tested is not loaded on the IC carrier 16 which is brought into electrical contact with that IC socket.

Where a defect or failure of an IC socket is detected by use of such method, even though an examination is conducted on an IC socket which has been determined to be defective, there are often the cases that no defect can be found in the defective IC socket, and hence there is a disadvantage that it takes a long time and requires many hands to look into the cause.

As a result of the examination of the cause, it was found that in case a specified IC carrier 16 mounted to the test tray TST has a defect or failure, the associated IC socket with which the specified IC carrier 16 was brought into electrical contact was determined to be defective even though the associated IC socket has no defect. Most of the cases that an IC carrier 16 is determined to be defective result from occurrence of a break in a portion of the IC pocket 19 of the IC carrier 16 for accommodating an IC element therein or from the slight remainder of a burr or fin in the molding of plastic for the IC carrier whereby terminals of the IC accommodated in the IC pocket 19 are deformed and are incompletely brought into contact with the corresponding IC socket.

The above-mentioned problem also will occur in case that an IC testing apparatus uses a handler of the type which can be used in common in transferring ICs accommodated in a square-shaped pipe-like IC container which is of substantially rectangular shape in section called a "rod-like magazine" and ICs loaded on a general-purpose tray onto a test tray and transporting the test tray loaded with the ICs thereon to the test section for testing, followed by various processings of the tested ICs on the basis of the data of the test results (for example, refer to Japanese Patent Application No. 171911/1994).

SUMMARY OF THE INVENTION

An object of the present invention is to provide an IC testing apparatus which can detect a defect of an IC socket mounted to a tester head as well as detect a defect of an IC carrier mounted to a test tray independently of the detection of a defective IC socket.

According to a first aspect of the present invention, there is provided an IC testing apparatus having a tester part and a handler part, and wherein ICs to be tested are loaded on a plurality of IC carriers, respectively, in a loader section of the handler part, the plurality of IC carriers are transported from the loader section into a test section of the handler part to test the ICs, after the completion of the test, the plurality of IC carriers with the tested ICs loaded thereon are transported from the test section to an unloader section of the handler part where the tested ICs on the IC carriers are transferred from the IC carriers onto a separate IC receiving container, and the IC carriers which has been emptied of the tested ICs are transported from the unloader section to the loader section, and the above operation is repeated, and further comprises: an IC carrier failure analysis memory for storing and accumulating therein the test results of the ICs one IC carrier by one IC carrier; decision means for determining whether the number of failure occurrences or the rate of failure occurrences stored in the IC carrier failure analysis memory exceeds a predetermined value or not; and control means for controlling the IC testing apparatus to set the state thereof to a preset state in accordance with the decision result of the decision means.

According to a second aspect of the present invention, there is provided an IC testing apparatus having a tester part and a handler part, and wherein one or more ICs to be tested are loaded on a test tray constructed by a frame and one or more IC carriers mounted on the frame in a loader section of the handler part, the test tray is transported from the loader section into a test section of the handler part where the IC or ICs loaded on the test tray are brought into electrical contact with one or more sockets mounted to a tester head of the tester part to test the ICs, after the completion of the test, the test tray with the tested IC or ICs loaded thereon is transported from the test section to an unloader section of the handler part where the tested IC or ICs on the test tray are transferred from the test tray onto a separate IC receiving container, and the test tray which has been emptied of the tested IC or ICs is transported from the unloader section to the loader section, and the above operation is repeated, and further comprises: an IC carrier failure analysis memory for storing and accumulating therein the test results of the ICs one IC carrier by one IC carrier; decision means for determining whether the number of failure occurrences or the rate of failure occurrences stored in the IC carrier failure analysis memory exceeds a predetermined value or not; and control means for controlling the IC testing apparatus to set the state thereof to a preset state in accordance with the decision result of the decision means.

According to a third aspect of the present invention, there is provided an IC testing apparatus having a tester part and a handler part, and wherein ICs to be tested are loaded on a test tray constructed by a frame and a plurality of IC carriers mounted on the frame in a loader section of the handler part, the test tray is transported from the loader section into a test section of the handler part where the semiconductor devices loaded on the test tray are brought into electrical contact with one or more sockets mounted to a tester head of the tester part to test the ICs, after the completion of the test, the test tray with the tested ICs loaded thereon is transported from the test section to an unloader section of the handler part where the tested ICs on the test tray are transferred from the test tray onto a separate IC receiving container, and the test tray which has been emptied of the tested ICs is transported from the unloader section to the loader section, and the above operation is repeated, and further comprises: an IC carrier failure analysis memory for storing and accumulating therein the failure results of the test results of the ICs to be tested loaded on the plurality of IC carriers mounted to each test tray one IC carrier by one IC carrier; decision means for determining whether the number of failure occurrences or the rate of failure occurrences stored in the IC carrier failure analysis memory exceeds a predetermined value or not; control means for controlling the IC testing apparatus to set the state thereof to a preset state in accordance with the decision result of the decision means; and a display for previously setting thereon at least a setting value for the number of failure occurrences, a setting value for the rate of failure occurrences, and a control state for the IC testing apparatus.

In a preferred embodiment, the decision means is set to a continuous mode in which a decision is rendered that when at least a predetermined number of ICs to be tested loaded on and carried by the identical IC carrier of the same test tray are continuously determined to be defective, the IC carrier is defective.

In a second preferred embodiment, the decision means is set to a yield mode in which a decision is rendered that when the number of failures every a predetermined number of ICs to be tested loaded on and carried by the identical IC carrier of the same test tray is determined to be equal to or more than a predetermined percentage, the IC carrier is defective.

In a third preferred embodiment, there is further provided decision mode setting means for selecting either the continuous mode or the yield mode and setting the selected one mode to the decision means.

In a fourth preferred embodiment, the display further has a failure stop control state in which the IC testing apparatus is controlled, when an IC carrier as determined to be defective is detected, to prevent an IC to be tested from being loaded on the IC carrier as determined to be defective in the loader section, an alarm control state in which the IC testing apparatus is controlled, when an IC carrier as determined to be defective is detected, to issue an alarm from the IC testing apparatus, and a failure stop alarm control state in which the IC testing apparatus is controlled, when an IC carrier as determined to be defective is detected, to prevent an IC to be tested from being loaded on the IC carrier as determined to be defective in the loader section as well as controlled to issue an alarm from the IC testing apparatus.

In a fifth preferred embodiment, the display has a failure stop category which functions to select a kind of a failure of an IC carrier from a plurality of categories and to set the selected one of the categories on the display, and only when the failure of the category set on the display occurs, the failure occurrence is stored in the IC carrier failure analysis memory.

In accordance with the IC testing apparatus of the first aspect of the invention, the number of failure occurrence or the rate of failure occurrences for each IC carrier is stored and accumulated in an IC carrier failure analysis memory one IC carrier by one IC carrier. In case the failure decision mode is set to the continuous mode, a decision is rendered that when a predetermined number of continuous test results for ICs to be tested loaded on and carried by the identical IC carrier are all determined to be defective, the IC carrier is defective. On the other hand, in case the failure decision mode is set to the yield mode, a decision is rendered that when a predetermined number of the tests for ICs are conducted and as a result, the rate of the failure occurrences for each IC carrier is equal to or more than a predetermined percentage, the associated IC carrier is defective. Accordingly, in either the continuous mode or the yield mode, the frequency of failure occurrences can be monitored for each IC carrier. Consequently, it is possible to detect the occurrence of failure due to a defect of an IC carrier independently of the detection of the occurrence of failure due to a defect of an IC socket.

In accordance with the IC testing apparatus of the second aspect and the third aspect of the invention, the number of failure occurrence for each IC carrier of one test tray is stored and accumulated one IC carrier by one IC carrier, and a decision is rendered that when the accumulated value is equal to or exceeds a setting value, the associated IC carrier on which the ICs as determined to be defective have been loaded is defective. Therefore, the cause of the failure occurrences can be recognized with a strong probability to be due to the IC carrier except a case that all or many of IC carriers disposed at the same position on all the test trays TST (IC carriers loaded thereon with ICs which are brought into contact with the identical socket of the tester head 104 ICs for testing) are determined to be defective. That is, in each of the test trays TST, when all or many of IC carriers loaded thereon with ICs brought into electrical contact with the identical socket for testing are determined to be defective, the decision is rendered that the cause of the failure occurrences can be due to a defect or failure of the associated IC socket. On the other hand, when the frequency of the failure occurrences of the ICs loaded on any one of the IC carriers mounted to a particular test tray, is high, the cause of the failure occurrences can be determined to be not due to a defect or failure of the IC socket, and hence the decision is rendered that the cause of the failure occurrences can be due to a defect or failure of the associated IC carrier.

Consequently, according to the present invention, it can be determined whether the failure occurrences of ICs are caused due to a defect of the IC socket or due to a defect of the IC carrier without taking a long time and requiring many hands or labors.

BEST MODE FOR CARRYING OUT THE INVENTION

Figure 1:
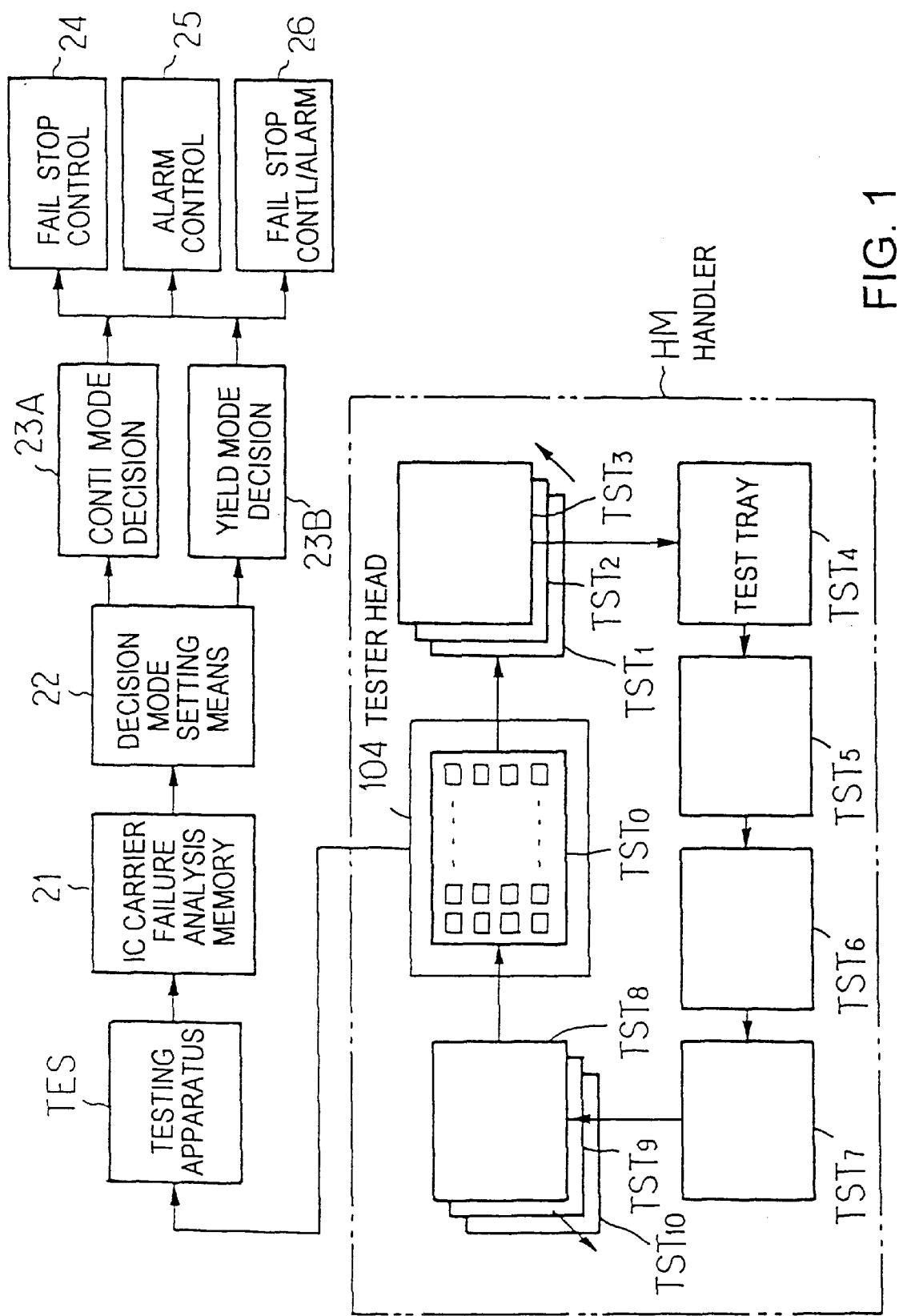
FIG. 1 is a schematic diagram explaining a construction of the main portion of an embodiment of the semiconductor device testing apparatus according to the present invention.
Figure 5:
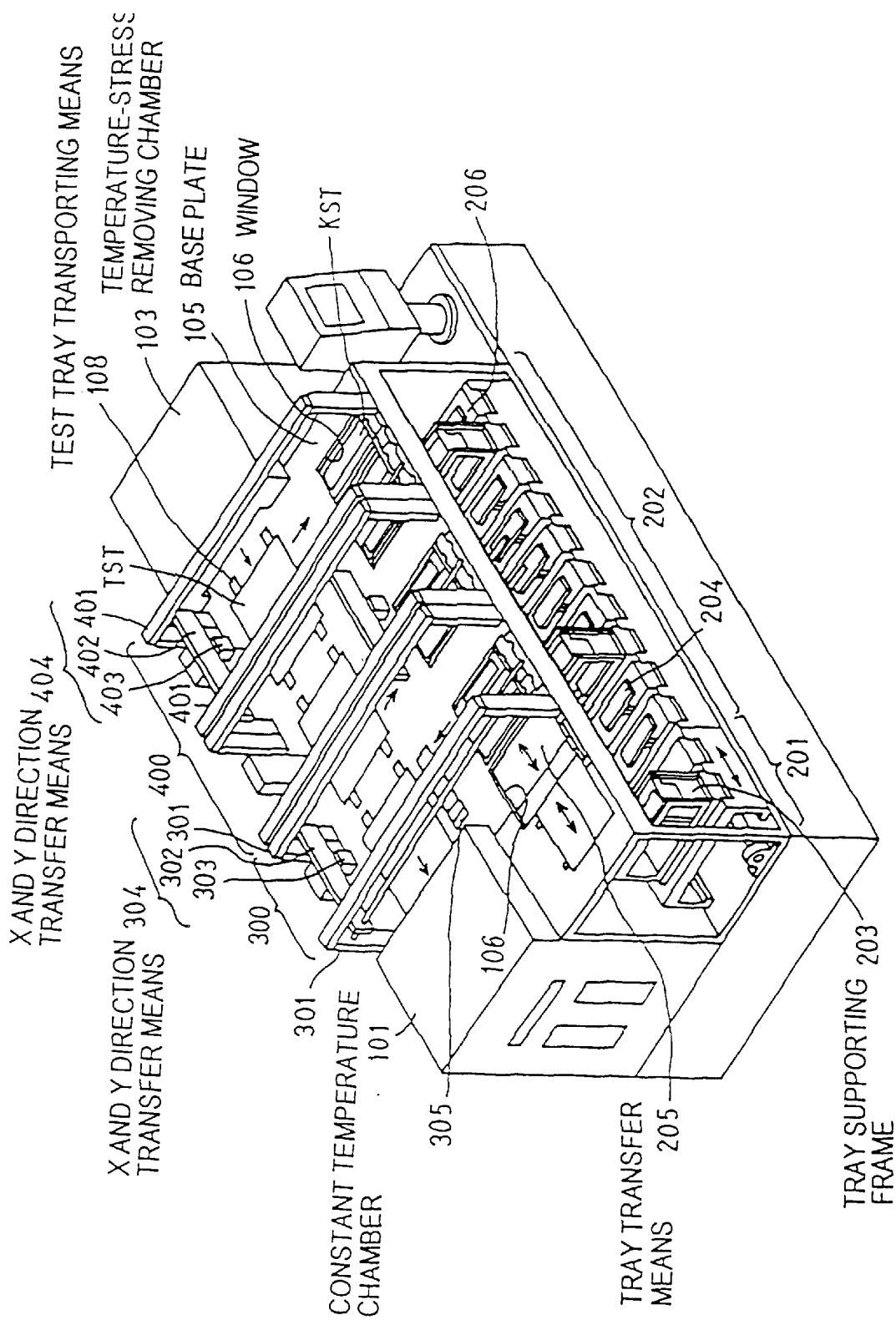
FIG. 5 is a perspective view of the conventional IC testing apparatus shown in FIG. 4.
Figure 6:
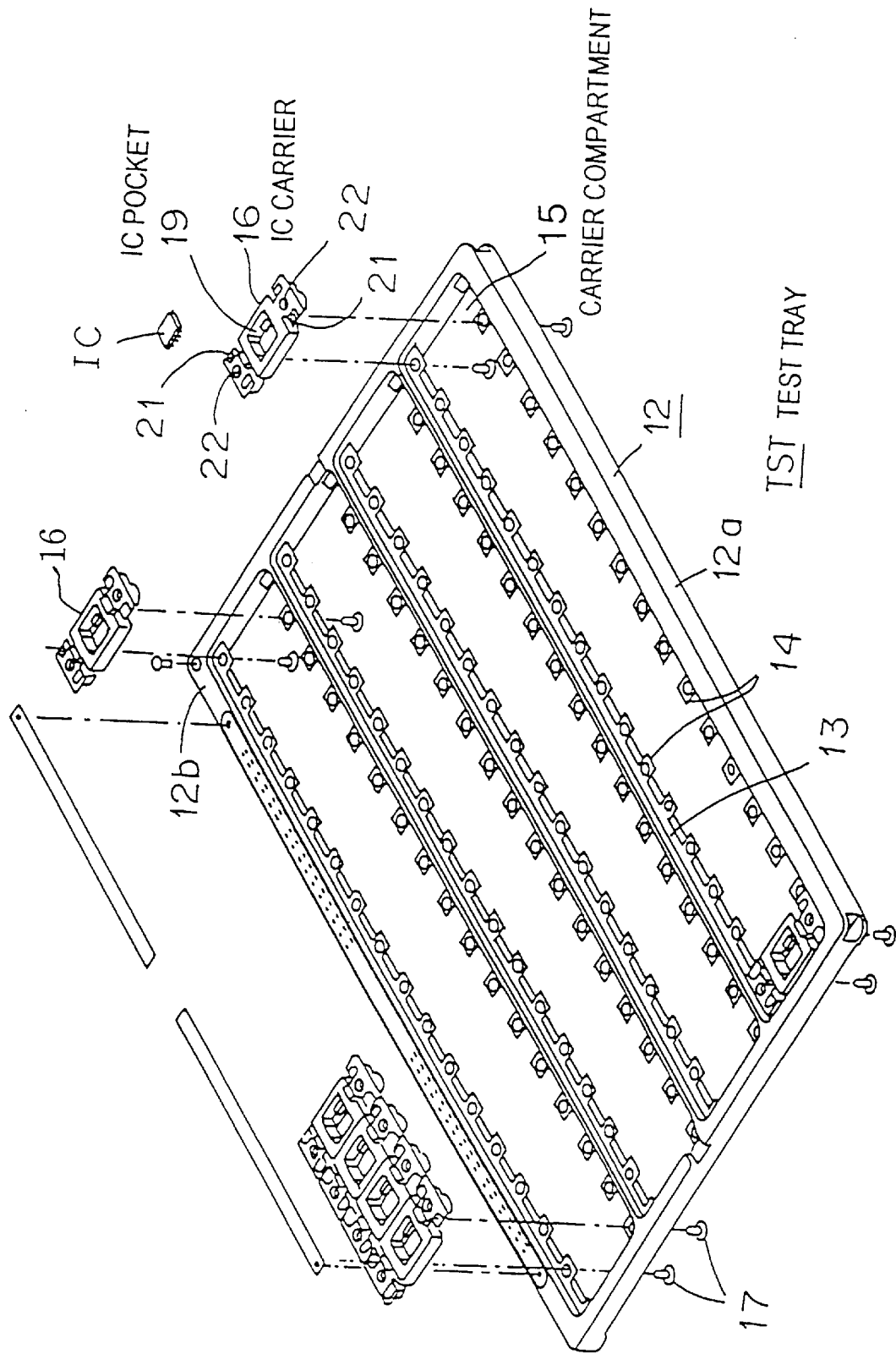
FIG. 6 is an exploded perspective view explaining the structure of an example of a test tray for use in the IC testing apparatus.
Figure 7:
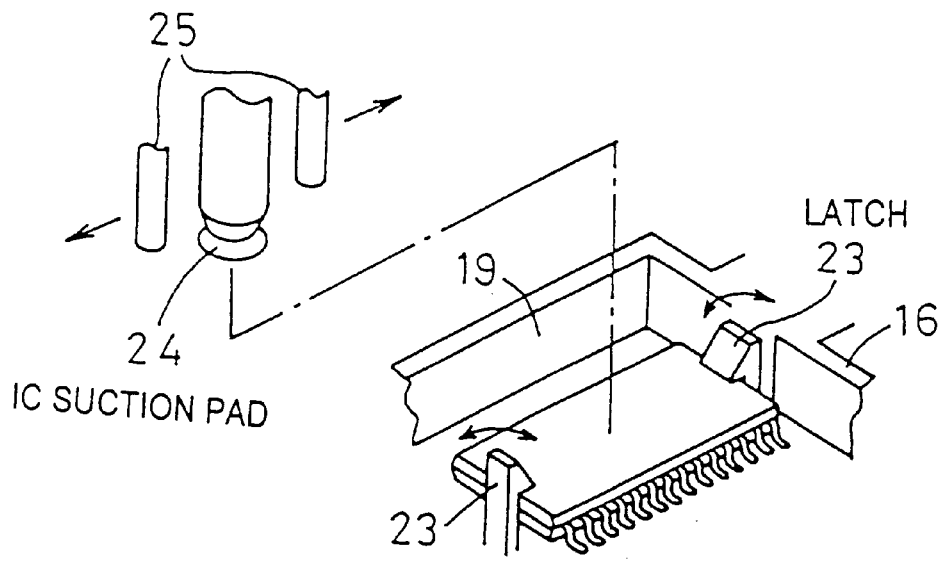
FIG. 7 is a perspective view explaining how ICs are loaded on the test tray depicted in FIG. 6.
Figure 8:
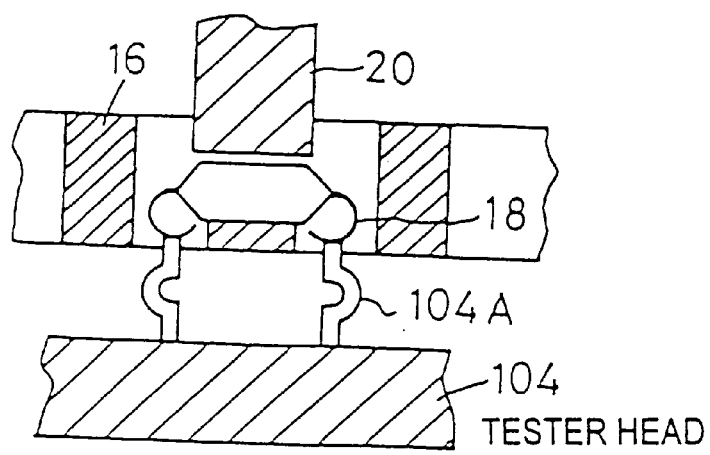
FIG. 8 is an enlarged sectional view illustrating an electrical connection between an IC loaded on the test tray shown in FIG. 6 and a tester head.
Figure 9:
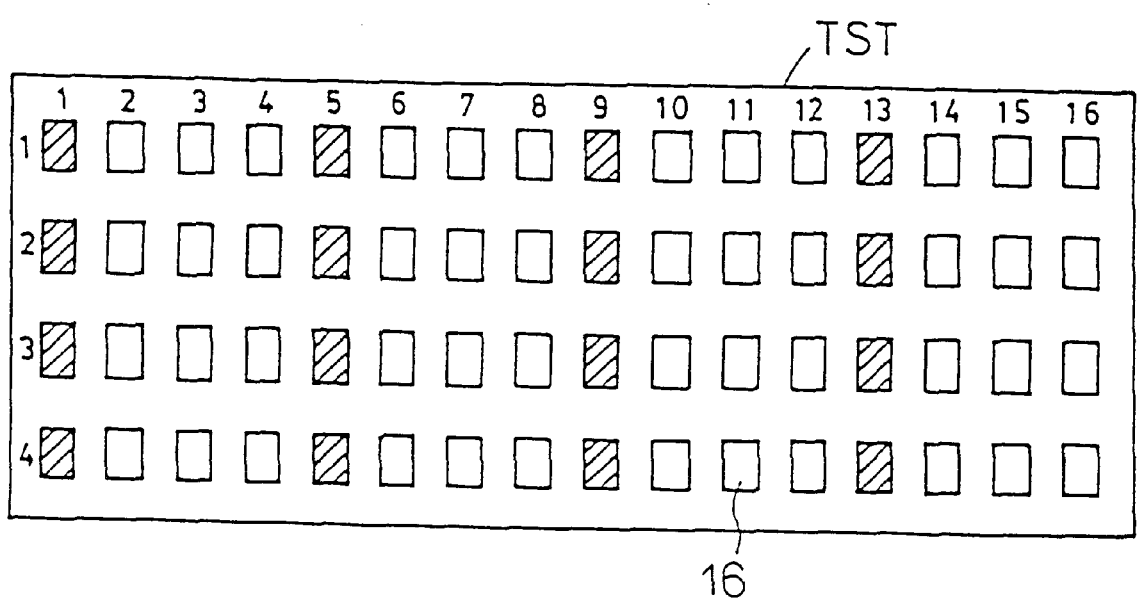
FIG. 9 is a plan view explaining a sequence of steps of testing the ICs to be tested loaded on the test tray.

FIG. 1 shows an embodiment of the IC testing apparatus according to the present invention. This IC testing apparatus has a handler of the horizontal transporting system mounted thereto as described above with reference to FIGS. 4 to 9, and comprises a tester part (principally the lower base portion in FIG. 5) which is an electrical portion of the IC testing apparatus for measuring the electrical characteristics of ICs under test by applying test signals of a predetermined pattern to the ICs, and a handler HM (principally the upper mechanical portion in FIG. 5).

Though the handler HM is illustrated in FIG. 1 in a simplified construction, the handler HM comprises, as with the conventional IC testing apparatus described above, a chamber section for testing ICs which have been carried on a test tray, an IC storage section for storing ICs to be tested and ICs already tested and sorted out, a loader section where ICs to be tested which a user has beforehand loaded on general-purpose trays are transferred and reloaded onto a test tray capable of withstanding high/low temperatures, and an unloader section where the tested ICs which have been carried on the test tray out of the chamber section subsequently to undergoing a test therein are transferred from the test tray to the general-purpose trays to be reloaded on the latter. The chamber section comprises a constant temperature chamber for imposing a temperature stress of either a designed high or low temperature on ICs to be tested loaded on a test tray, a test chamber for conducting electrical tests on the ICs under the temperature stress imposed in the constant temperature chamber by bringing the ICs into electrical contact with sockets of a tester head of the tester part, and a temperature-stress removing chamber for removing the temperature stress imposed in the constant temperature chamber from the ICs having undergone the tests in the test chamber.

The embodiment of FIG. 1 shows a case in which eleven (11) test trays TST are used in the handler HM. $TST_0$ denotes a test tray which is stopping at the position of the tester head 104 in the test chamber. It is assumed that the remaining test trays are allocated the numbers $TST_1$ through $TST_{10}$ in turn in the moving direction of the test trays starting at the test tray $TST_0$. The tester head 104 has a testing apparatus TES connected thereto, which is formed in the form of a box-shape and is called a main frame. In the testing apparatus TES is accommodated a tester part for generating a test signal of a predetermined pattern to be applied to the ICs to be tested loaded on the test tray via the tester head 104, an address signal and the like, and for receiving and processing the response signals from the ICs to be tested to measure the electrical characteristics of the ICs to be tested.

Figure 2:
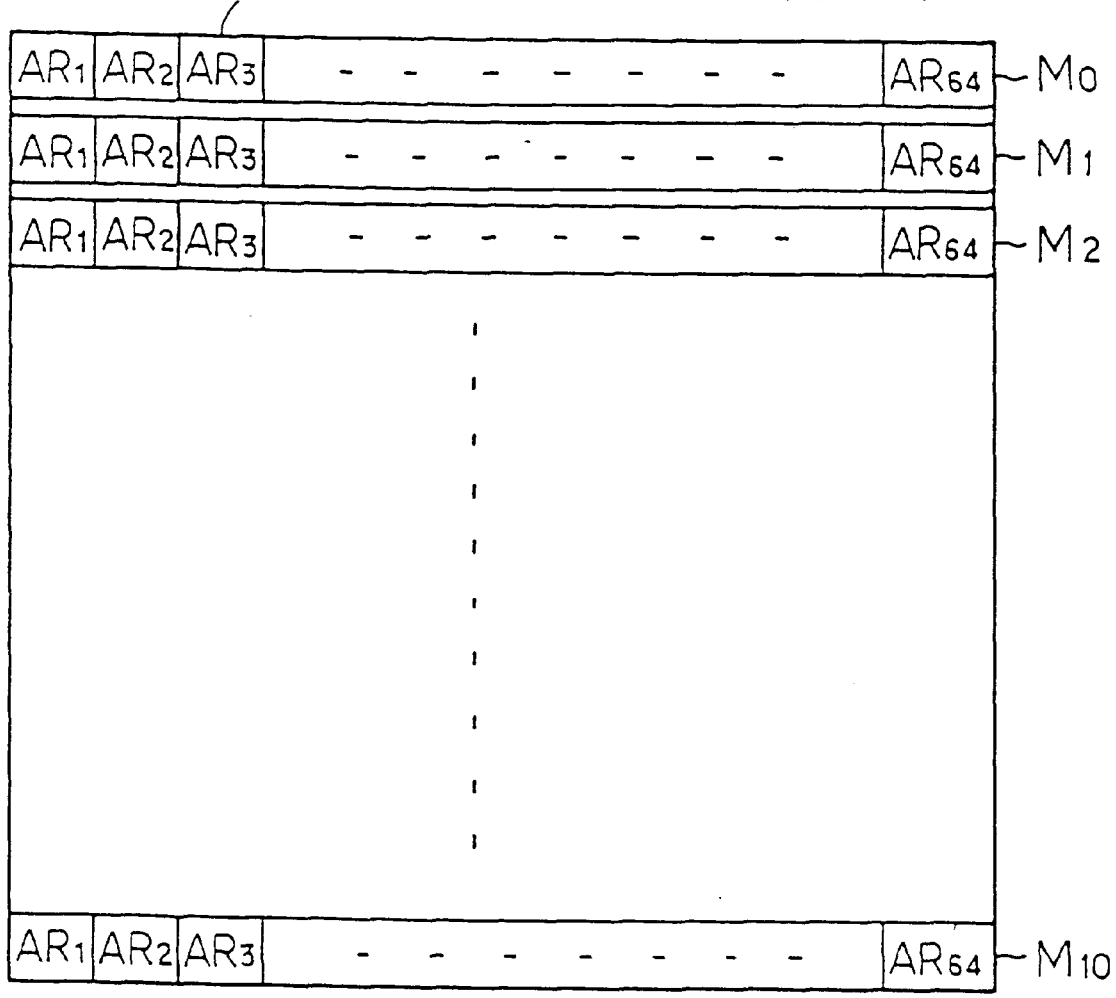
FIG. 2 is a schematic diagram explaining an example of the internal structure of the carrier failure analysis memory used in the semiconductor device testing apparatus shown in FIG. 1.

In the present invention, there is provided an IC carrier failure analysis memory 21 for storing therein the test results obtained in the testing apparatus TES in correspondence with each of the test trays $TST_0$–$TST_{10}$. As shown in FIG. 2, the IC carrier failure analysis memory 21 has memory areas $M_0$–$M_{10}$ corresponding to the test trays $TST_0$–$TST_{10}$ respectively and sets in each of the memory areas $M_0$–$M_{10}$ addresses corresponding to the IC carriers 16 mounted to each of the test trays $TST_0$–$TST_{10}$. In this embodiment, since 64 IC carriers 16 are mounted to each test tray TST, storage addresses $AR_1$–$AR_{64}$ the number of which corresponds to that (64) of IC carriers are set in each of the memory areas $M_0$–$M_{10}$. The number of times that each IC carrier 16 is used and the number of failure occurrence on each IC carrier 16 are stored at the corresponding one of the storage addresses $AR_1$–$AR_{64}$.

Moreover, in the present invention, there are provided, in addition to the IC carrier failure analysis memory 21, decision mode setting means 22 for setting a mode for determining that an IC carrier 16 is defective, continuous mode decision means 23A which operates when a continuous mode is set by this decision mode setting means 22, yield mode decision means 23B which operates when an yield mode is set by the decision mode setting means 22, and control means 24, 25 and 26 for controlling the IC testing apparatus to take a preset state in accordance with the results of decision of the continuous mode decision means 23A and the yield mode decision means 23B. Further, in this example, the continuous mode and the yield mode are provided as the decision mode, but the decision mode is not limited to those modes.

Figure 3:
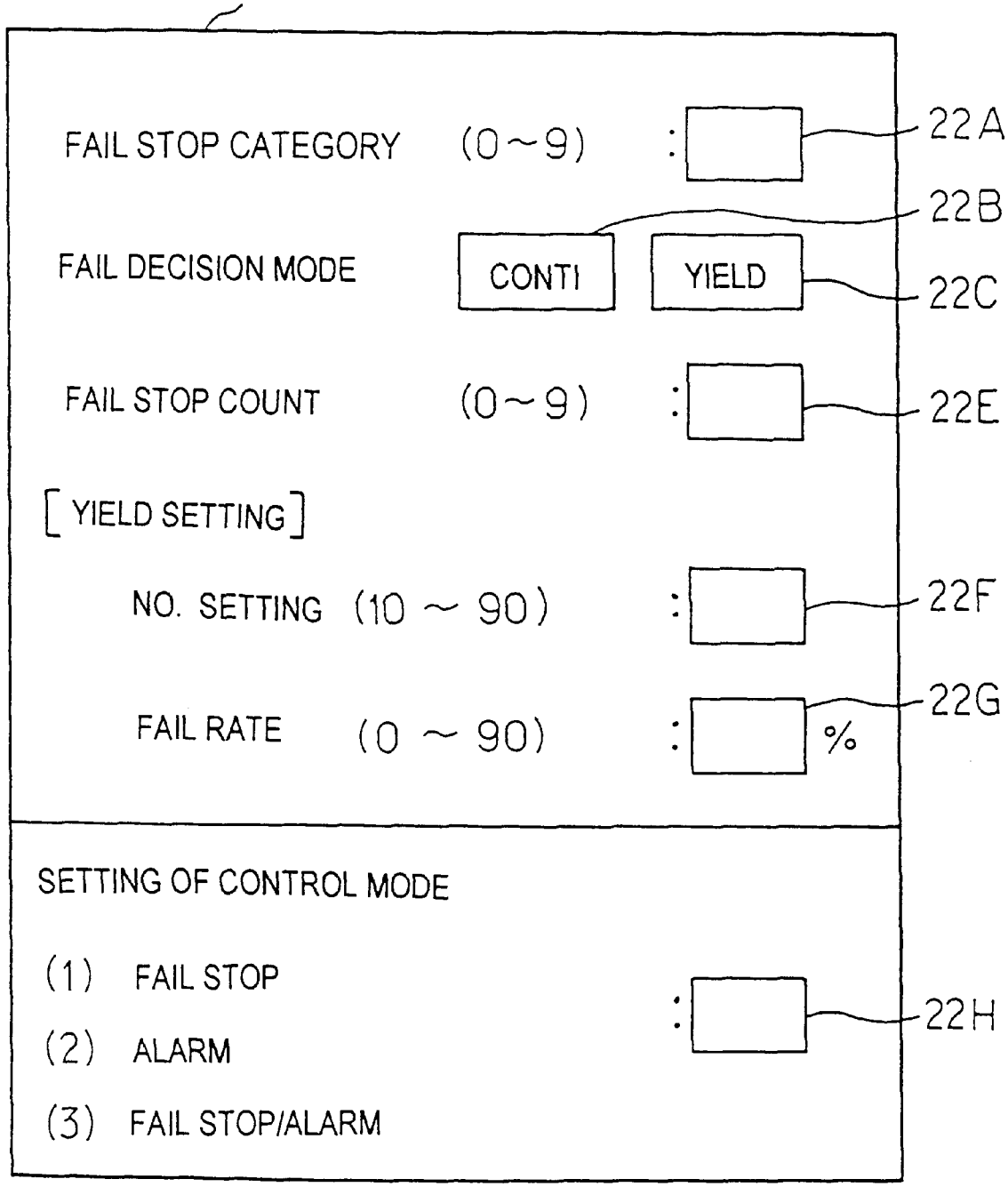
FIG. 3 is a schematic diagram explaining an example of the decision mode setting means used in the semiconductor device testing apparatus shown in FIG. 1.
Figure 4:
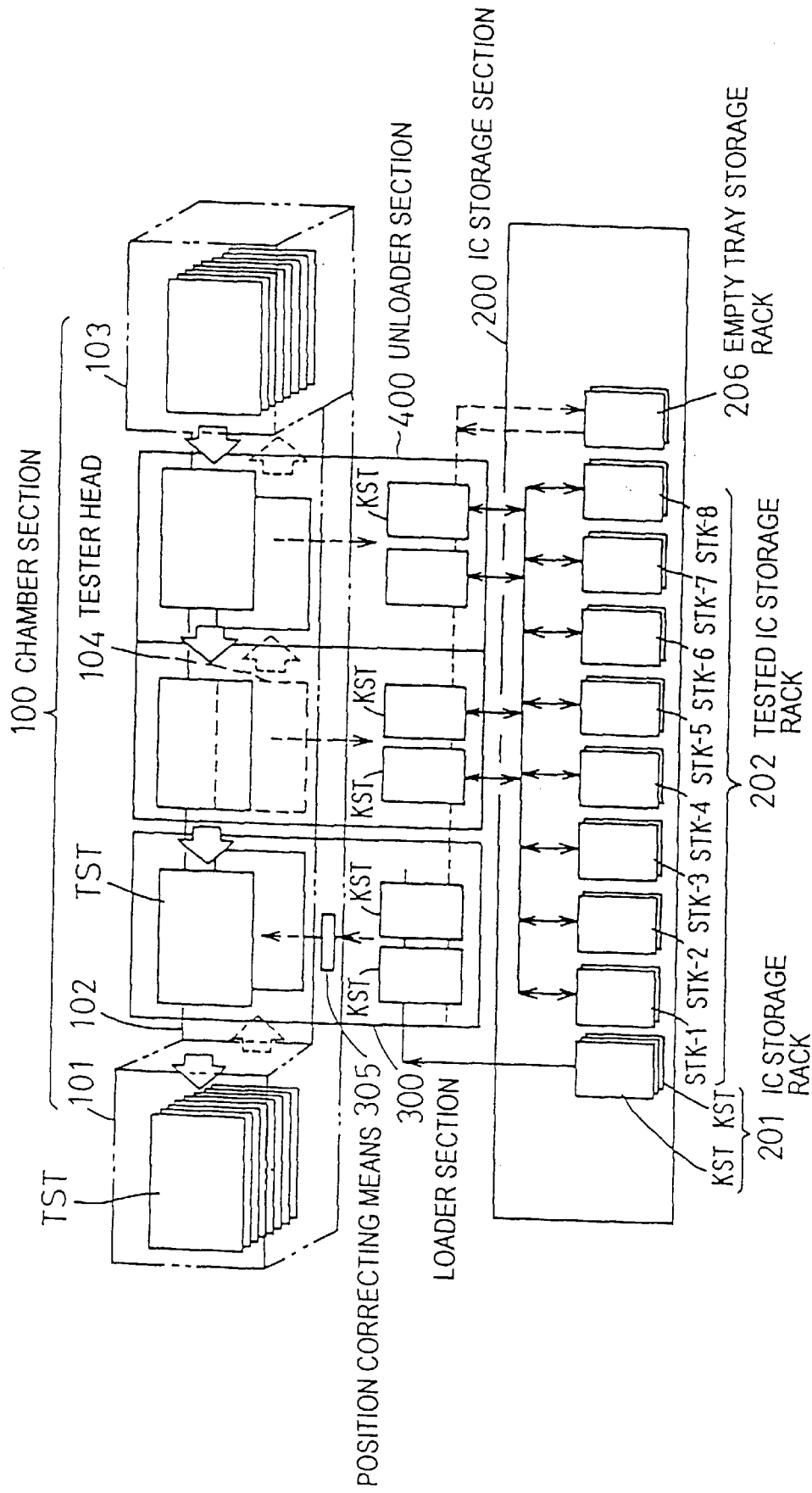
FIG. 4 is a plan view schematically showing a conventional IC testing apparatus with the chamber section viewed in perspective.

FIG. 3 shows an example of a display screen for mode setting on a display device of the decision mode setting means 22. The item of "FAILURE STOP CATEGORY" displayed in the first row represents a kind of a failure of an IC. That is, when the testing apparatus TES determines an IC to be a failure or unconformable IC, a kind of this failure (failures considered to occur mainly based on poor contact) is classified into ten (10) categories from 0 to 9 (0–9) and any one of the numbers 0–9 corresponding to the failure kind is inputted into a setting window 22A located at the right hand side of this first row. The kinds of failures are specified to one of the categories by this inputted kind, and when the failure of this specified kind occurs, a counting operation for detecting a defective IC carrier is performed.

The item of "FAILURE DECISION MODE" in the second row is used for setting one of a continuous mode and an yield mode. When the continuous mode is set, the cursor (not shown) is placed on the setting window 22B of "CONTINUOUS", and when the yield mode is set, the cursor is placed on the setting window 22C of "YIELD", and then a return key is depressed. By this operation, the continuous mode or the yield mode can be set. When the continuous mode is selected, the cursor is moved to the setting window 22E of the item of "FAILURE STOP COUNT" in the third row.

The item of the FAILURE STOP COUNT in the third row is used to set the number of times that the specified kind of failure specified in the item of the FAILURE STOP CATEGORY in the first row continuously occurs, i.e., the number of continuous occurrences of the specified kind of failure by which an IC carrier 16 is determined to be defective, and the number of failure occurrences (0–9) is inputted to the setting window 22E located at the right hand side of the third row. Further, when 0 is inputted to the setting window 22E, even if "CONTINUOUS" is set in the item of the FAILURE DECISION MODE in the second row, it is decided that the continuous mode is not set.

When "YIELD" is set in the item of the FAILURE DECISION MODE in the second row, the cursor is moved to the setting window 22F of the item of the SETTING OF THE NUMBER OF ICs in the fifth row. A numeric value in the range of, for example, 10–90 corresponding to a denominator of the yield is set in this setting window 22F. For example, when 10 is set in the setting window 22F, an yield is calculated every time ICs are loaded on and carried by the same IC carrier ten times and the tests for the ICs carried by the same IC carrier are conducted ten times in the test chamber, and a decision is rendered whether the IC carrier is defective or not on the basis of the calculated yield. The accumulated value of the continuous failure occurrences is reset every time the tests for the ten ICs carried by the same IC carrier are all completed.

When the input operation of the numeric value into the setting window 22F is completed, the cursor is moved to the setting window 22G of the item of "FAILURE RATE" in the sixth row. A percentage (%) of the failure rate is set in this setting window 22G using a numerical value in the range of, for example, 0–90.

In this example, a setting space of control mode is prepared at the lower side of the display screen of the decision mode setting means 22. The control mode setting space has three items, namely, (1) FAILURE STOP, (2) ALARM, and (3) FAILURE STOP ALARM, and is provided for setting a state or control mode to which the IC testing apparatus is to be controlled when an IC carrier is determined to be a defective IC carrier.

The FAILURE STOP of the item (1) represents a set state in which when an IC carrier as determined to be defective is detected, the IC testing apparatus is controlled to prevent an IC to be tested from being loaded on the IC carrier as determined to be defective in the loader section.

The ALARM of the item (2) represents a set state in which the IC testing apparatus is controlled to issue an alarm when an IC carrier as determined to be defective is detected.

The FAILURE STOP ALARM of the item (3) represents a set state in which when an IC carrier as determined to be defective is detected, the IC testing apparatus is controlled to prevent an IC to be tested from being loaded on the IC carrier as determined to be defective as well as to issue an alarm.

Such setting operation of the control mode is performed by inputting, for example, an item number of the items (1)–(3) into a setting window 22H located at the right hand side of the control mode setting space.

In the decision mode setting means 22, when the FAILURE DECISION MODE of the item in the second row and its numerical value condition are set, the continuous mode decision means 23A or the yield mode decision means 23B is activated in accordance with the set decision mode. For example, when the continuous mode is set, the continuous mode decision means 23A is activated.

In the continuous mode, only when an IC loaded on each IC carrier 16 is determined to be failure and the kind of its failure coincides with the kind of failure set in the setting window 22A, the number of failure occurrence "1" is stored in each of the addresses $AR_1$–$AR_{64}$. The number of failure occurrence is accumulated in each address. When failures occur continuously and the number of failure occurrences exceeds the numeric value set in the setting window 22E, the associated IC carrier is determined to be defective. When an IC carrier is determined to be defective, one of the control means 24, 25 and 26 corresponding to the control mode set in the control mode setting window 22H is activated and the IC testing apparatus is controlled in the set control mode.

On the other hand, when the yield mode is set, the yield mode decision means 23B is activated and the test results are accumulated for each IC carrier every predetermined number of times set in the setting window 22F, for example, every ten times. As a result, when the failure rate exceeds a predetermined percentage, for example, 50% set in the setting window 22G, the associated IC carrier is determined to be defective, and then one of the control means 24, 25 and 26 corresponding to the control mode set in the control mode setting window 22H is activated.

As mentioned above, in the yield mode, in case a numerical value "10" is set in the setting window 22F for example, the accumulated value of the number of failure occurrences stored in the IC carrier failure analysis memory 21 is reset every time ICs are loaded on and carried by each IC carrier ten times and the tests for the ten ICs are all completed. Therefore, in this example, the yield is determined every ten tests and when the yield value is equal to or exceeds the yield value set in the setting window 22G, one of the control means 24, 25 and 26 is activated.

As described above, according to the present invention, since the number of IC failure occurrences is stored and accumulated for each IC carrier mounted to each test tray TST and when the accumulated value is equal to or exceeds the predetermined value, the associated IC carrier loaded thereon with those failure ICs is determined to be defective, the cause of the failure occurrences can be recognized with a strong probability to be due to the IC carrier except a case that all or many of IC carriers disposed at the same position on all the test trays TST (IC carriers loaded thereon with ICs which are brought into contact with the identical socket of the tester head 104 ICs for testing) are determined to be defective. That is, in each of the test trays TST, when all or many of IC carriers loaded thereon with ICs brought into contact with the identical socket for testing are determined to be defective, the decision is rendered that the cause of the failure occurrences can be due to a defect or failure of the associated IC socket.

On the other hand, when the frequency of the failure occurrences of the ICs loaded on any one of the IC carriers 16 mounted to a particular test tray, for example, the test tray $TST_0$ is high, the cause of the failure occurrences can be determined to be not due to a defect or failure of the IC socket. Therefore, the decision is rendered that the cause of the failure occurrences can be due to a defect or failure of the associated IC carrier 16.

Consequently, according to the present invention, it can be determined whether the failure occurrences of ICs are caused by a defect of the IC socket or by a defect of the IC carrier without taking a long time and requiring a large number of hands. Accordingly, there is obtained an advantage that the cause of the failure occurrences can be specified within a short period of time and an IC testing apparatus which has an improved accuracy and is easy to use can be provided.

In the aforementioned embodiment, the present invention is applied to an IC testing apparatus in which a handler of horizontal transporting system is connected to an IC tester. However, it is needless to say that the present invention can be also applied to an IC testing apparatus having a magazine/tray type handler connected thereto of the type which can be used in common in transferring ICs accommodated in an IC container called a "rod-like magazine" and ICs loaded on a general-purpose tray onto a test tray and transporting the test tray loaded with the ICs thereon to the test section for testing, followed by various processings of the tested ICs on the basis of the data of the test results, and the same function and effects can be obtained therefrom. In case of using the handler of this type, ICs accommodated in a rod-like magazine are successively slid down by their own weights, that is, ICs are discharged out of the magazine by the natural dropping force of each IC by its own weight by supporting the rod-like magazine in an inclined state from its horizontal state, and a station where ICs discharged out of the magazine are transferred onto a test tray is defined as a loader section.

While the present invention has been described in the above as being applied to the IC testing apparatus for testing ICs as semiconductor devices, it is needless to say that the present invention is also applicable to a semiconductor device testing apparatus for testing semiconductor devices other than ICs, and the same function and effects are obtained as described above.

What is claimed is:

1. A semiconductor device testing apparatus having a tester part and a handler part, and wherein semiconductor devices to be tested are loaded on a plurality of semiconductor device carriers, respectively, in a loader section of said handler part, said plurality of semiconductor device carriers are transported from said loader section into a test section of said handler part to test the semiconductor devices, after the completion of the test, said plurality of semiconductor device carriers with the tested semiconductor devices loaded thereon are transported from said test section to an unloader section of said handler part where the tested semiconductor devices on said semiconductor device carriers are transferred from said semiconductor device carriers onto a separate semiconductor device receiving container, and the semiconductor device carriers which has been emptied of the tested semiconductor devices are transported from said unloader section to said loader section, and the above operation is repeated, said semiconductor device testing apparatus further comprising:
  a semiconductor device carrier failure analysis memory for storing and accumulating therein the test results of the semiconductor devices one semiconductor device carrier by one semiconductor device carrier;
  decision means for determining whether the number of failure occurrences or the rate of failure occurrences stored in said semiconductor device carrier failure analysis memory exceeds a predetermined value or not; and
  control means for controlling the semiconductor device testing apparatus to set the state thereof to a preset state in accordance with the decision result of said decision means.

2. A semiconductor device testing apparatus having a tester part and a handler part, and wherein one or more semiconductor devices to be tested are loaded on a test tray constructed by a frame and one or more semiconductor device carriers mounted on said frame in a loader section of said handler part, said test tray is transported from said loader section into a test section of said handler part where the semiconductor device or devices loaded on said test tray are brought into electrical contact with one or more sockets mounted to a tester head of said tester part to test the semiconductor devices, after the completion of the test, said test tray with the tested semiconductor device or devices loaded thereon is transported from said test section to an unloader section of said handler part where the tested semiconductor device or devices on said test tray are transferred from said test tray onto a separate semiconductor device receiving container, and the test tray which has been emptied of the tested semiconductor device or devices is transported from said unloader section to said loader section, and the above operation is repeated, said semiconductor device testing apparatus further comprising:
  a semiconductor device carrier failure analysis memory for storing and accumulating therein the test results of the semiconductor devices one semiconductor device carrier by one semiconductor device carrier;
  decision means for determining whether the number of failure occurrences or the rate of failure occurrences stored in said semiconductor device carrier failure analysis memory exceeds a predetermined value or not; and
  control means for controlling the semiconductor device testing apparatus to set the state thereof to a preset state in accordance with the decision result of said decision means.

3. The semiconductor device testing apparatus according to claim 2, wherein said decision means is set to a continuous mode in which a decision is rendered that when at least a predetermined number of semiconductor devices to be tested loaded on and carried by the identical semiconductor device carrier of the same test tray are continuously determined to be defective, said semiconductor device carrier is defective.

4. The semiconductor device testing apparatus according to claim 2, wherein said decision means is set to a yield mode in which a decision is rendered that when the number of failures every a predetermined number of semiconductor devices to be tested loaded on and carried by the identical semiconductor device carrier of the same test tray is determined to be equal to or more than a predetermined percentage, said semiconductor device carrier is defective.

5. The semiconductor device testing apparatus according to claim 2, further comprising:
  decision mode setting means for selecting either said continuous mode or said yield mode and setting the selected one mode to said decision means.

6. The semiconductor device testing apparatus according to claim 1, wherein said control means controls the semiconductor device testing apparatus to set the state thereof to a failure stop control state in which the semiconductor device testing apparatus is controlled, when a semiconductor device carrier as determined to be defective is detected, to prevent a semiconductor device to be tested from being loaded on said semiconductor device carrier as determined to be defective in the loader section.

7. The semiconductor device testing apparatus according to claim 1, wherein said control means controls the semiconductor device testing apparatus to set the state thereof to an alarm control state in which the semiconductor device testing apparatus is controlled, when a semiconductor device carrier as determined to be defective is detected, to issue an alarm from the semiconductor device testing apparatus.

8. The semiconductor device testing apparatus according to claim 1, wherein said control means controls the semiconductor device testing apparatus to set the state thereof to a failure stop alarm control state in which the semiconductor device testing apparatus is controlled, when a semiconductor device carrier as determined to be defective is detected, to prevent a semiconductor device to be tested from being loaded on said semiconductor device carrier as determined to be defective in the loader section as well as controlled to issue an alarm from the semiconductor device testing apparatus.

9. A semiconductor device testing apparatus having a tester part and a handler part, and wherein semiconductor devices to be tested are loaded on a test tray constructed by a frame and a plurality of semiconductor device carriers mounted on said frame in a loader section of said handler part, said test tray is transported from said loader section into a test section of said handler part where the semiconductor devices loaded on said test tray are brought into electrical contact with one or more sockets mounted to a tester head of said tester part to test the semiconductor devices, after the completion of the test, said test tray with the tested semiconductor devices loaded thereon is transported from said test section to an unloader section of said handler part where the tested semiconductor devices on said test tray are transferred from said test tray onto a separate semiconductor device receiving container, and the test tray which has been emptied of the tested semiconductor devices is transported from said unloader section to said loader section, and the above operation is repeated, said semiconductor device testing apparatus further comprising:
  a semiconductor device carrier failure analysis memory for storing and accumulating therein the failure results of the test results of the semiconductor devices to be tested loaded on said plurality of semiconductor device carriers mounted to each test tray one semiconductor device carrier by one semiconductor device carrier;
  decision means for determining whether the number of failure occurrences or the rate of failure occurrences stored in said semiconductor device carrier failure analysis memory exceeds a predetermined value or not;
  control means for controlling the semiconductor device testing apparatus to set the state thereof to a preset state in accordance with the decision result of said decision means; and
  a display for previously setting thereon at least a setting value for said number of failure occurrences, a setting value for said rate of failure occurrences, and a control state for the semiconductor device testing apparatus.

10. The semiconductor device testing apparatus according to claim 9, wherein said display further has a failure decision mode in which either a continuous mode or a yield mode is selected.

11. The semiconductor device testing apparatus according to claim 10, wherein said continuous mode is a failure decision mode in which a decision is rendered that when semiconductor devices to be tested loaded on and carried by the identical semiconductor device carrier of the same test tray are continuously determined to be defective and the number of the semiconductor devices as continuously determined to be defective is equal to or more than the number of failure occurrences set on said display, said semiconductor device carrier is defective.

12. The semiconductor device testing apparatus according to claim 10, wherein said yield mode is a failure decision mode in which a decision is rendered that when the number of failures every a predetermined number of semiconductor devices to be tested loaded on and carried by the identical semiconductor device carrier of the same test tray is determined to be equal to or more than the rate of failure occurrences set on said display, said semiconductor device carrier is defective.

13. The semiconductor device testing apparatus according to claim 9, wherein said display has:
  a failure stop control state in which the semiconductor device testing apparatus is controlled, when a semiconductor device carrier as determined to be defective is detected, to prevent a semiconductor device to be tested from being loaded on said semiconductor device carrier as determined to be defective in the loader section;
  an alarm control state in which the semiconductor device testing apparatus is controlled, when a semiconductor device carrier as determined to be defective is detected, to issue an alarm from the semiconductor device testing apparatus; and
  a failure stop alarm control state in which the semiconductor device testing apparatus is controlled, when a semiconductor device carrier as determined to be defective is detected, to prevent a semiconductor device to be tested from being loaded on said semiconductor device carrier as determined to be defective in the loader section as well as controlled to issue an alarm from the semiconductor device testing apparatus.

14. The semiconductor device testing apparatus according to claim 9, wherein said display has a failure stop category which functions to select a kind of a failure of a semiconductor device carrier from a plurality of categories and to set the selected one of the categories on the display, and only when the failure of the category set on the display occurs, the failure occurrence is stored in said semiconductor device carrier failure analysis memory.

15. The semiconductor device testing apparatus according to claim 2, wherein said handler part is a magazine/tray type handler of the type which can be used in common in transferring semiconductor devices accommodated in a semiconductor device container called a rod-like magazine and semiconductor devices loaded on a general-purpose tray onto a test tray and transporting the test tray loaded with the semiconductor devices thereon to the test section for testing, followed by performing various processings on the tested semiconductor devices on the basis of the data of the test results in the unloader section, and said loader section is a station where semiconductor devices discharged out of the magazine are transferred onto a test tray.

16. The semiconductor device testing apparatus according to claim 2, wherein said handler part is a handler called a horizontal transporting system in which semiconductor devices loaded on a general-purpose tray are transferred onto a test tray in said loader section, and the test tray loaded with the semiconductor devices thereon is transported to the test section for testing, followed by performing various processings on the tested semiconductor devices on the basis of the data of the test results in the unloader section.

\* \* \* \* \*